US011531519B2

(12) United States Patent
Beiser et al.

(10) Patent No.: US 11,531,519 B2
(45) Date of Patent: Dec. 20, 2022

(54) COLOR SLIDER

(71) Applicant: Waves Audio Ltd., Tel Aviv (IL)

(72) Inventors: Inon Beiser, Raanana (IL); Meir Shaashua, Tel Aviv (IL); Itai Neoran, Beit Hananya (IL); Shai Mantzur, Givatayim (IL)

(73) Assignee: Waves Audio Ltd., Tel Aviv (IL)

( * ) Notice: Subject to any disclaimer, the term of this patent is extended or adjusted under 35 U.S.C. 154(b) by 0 days.

(21) Appl. No.: 17/352,303

(22) Filed: Jun. 20, 2021

(65) Prior Publication Data

US 2021/0397409 A1 Dec. 23, 2021

(51) Int. Cl.
G06F 3/16 (2006.01)
G06F 3/04847 (2022.01)
G06F 16/64 (2019.01)

(52) U.S. Cl.
CPC .......... G06F 3/165 (2013.01); G06F 3/04847 (2013.01); G06F 16/64 (2019.01)

(58) Field of Classification Search
CPC ....................................................... G06F 3/16
See application file for complete search history.

(56) References Cited

U.S. PATENT DOCUMENTS 8,198,525 B2    6/2012  Homburg

FOREIGN PATENT DOCUMENTS

WO    2015035492 A1    3/2015

OTHER PUBLICATIONS

De Man, B., Reiss, J. and Stables, R., 2017. Ten years of automatic mixing. Proceedings of the 3rd Workshop on Intelligent Music Production, Salford, UK, Sep. 15, 2017.
GB2009452.0 1st search and examination report.
GB2009452.0 response to 1st examination report.
Zotope Web page including video https://www.izotope.com/en/learn/how-to-use-mix-assistant.html.

Primary Examiner — Olisa Anwah
(74) Attorney, Agent, or Firm — Dr. Hanar Farber Patent Agent Ltd.

(57) ABSTRACT

Adjusting gains of an audio mix. Audio tracks using respective gains are individually analyzed to compute a first metric of frequency content. A user input specifies a desired second metric of the frequency content. Responsive to the user input, respective gains of the audio tracks are collectively and simultaneously adjusted to produce respective adjusted gains of the audio tracks. A second audio mix when played of the audio tracks with the respective adjusted gains has a third metric of frequency content different from the first metric of frequency content. The third metric is closer to the second metric than said first metric.

18 Claims, 4 Drawing Sheets

COLOR SLIDER

BACKGROUND

1. Technical Field

Aspects of the present invention relate to digital signal processing of audio signals, and particularly to a digital audio workstation for processing audio tracks and audio mixing.

2. Description of Related Art

A digital audio workstation (DAW) is an electronic device or software application for recording, editing and producing audio files such as musical pieces, speech or sound effects. DAWs typically provide a user interface that allows the user to record, edit and mix multiple recordings and tracks into a mixed audio production. Modern computer-based DAWs support software plug-ins, each having its own functionality, which may expand the sound processing capabilities of the DAW. There are software plug-ins, for example, for equalization, limiting, compression, reverberation and echo. Software plug-ins may provide further audio sources within a DAW such as virtual instruments.

BRIEF SUMMARY

Various methods performable in a computer system are described herein for adjusting gains of an audio mix. An audio mix is provided including multiple audio tracks and respective gains. The audio tracks using the respective gains are individually analyzed to compute therefrom a first metric of frequency content. A user input specifies a desired second metric of the frequency content. Responsive to the user input, respective gains of the audio tracks are collectively and simultaneously adjusted to produce respective adjusted gains of the audio tracks. A second audio mix when played of the audio tracks with the respective adjusted gains have a third metric of frequency content different from the first metric of frequency content. The third metric is closer to the second metric than the first metric. The audio tracks using the respective adjusted gains may be mixed into the second audio mix and the second audio mix may be played. The second metric may be responsive to a control parameter for collectively and simultaneously adjusting the respective gains of the audio tracks. The second metric of the second audio mix may be responsive to a single control parameter for collectively and simultaneously adjusting the respective gains of the audio tracks. A control may be provided on a user interface. The control may be configured for the collective and simultaneous adjustment of the respective gains of the audio tracks.

Analysis of the audio tracks may include providing a previously determined frequency-dependent audio filter; The audio filter may be applied respectively to the audio tracks and respective values of loudness may be measured. Adjustment of the respective gains of the audio tracks may be responsive to the measured values of loudness.

Analysis of the audio tracks may include providing multiple previously determined frequency-dependent audio filters including a first filter and a second filter. The first filter and said second filter may have different audio frequency responses. The first filter and the second filter may be applied respectively to the audio tracks and values of loudness measured respective to the first filter and the second filter. Adjustment of the respective gains of the audio tracks may be responsive to a difference between the values of loudness respective to the first filter and the second filter.

Adjustment of the respective gains of the audio tracks may include normalization thereby maintaining loudness of the second audio mix.

Various user interfaces are disclosed herein including for performing the methods as disclosed herein in a computer system.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

The invention is herein described, by way of example only, with reference to the accompanying drawings, wherein.

Figure 1:
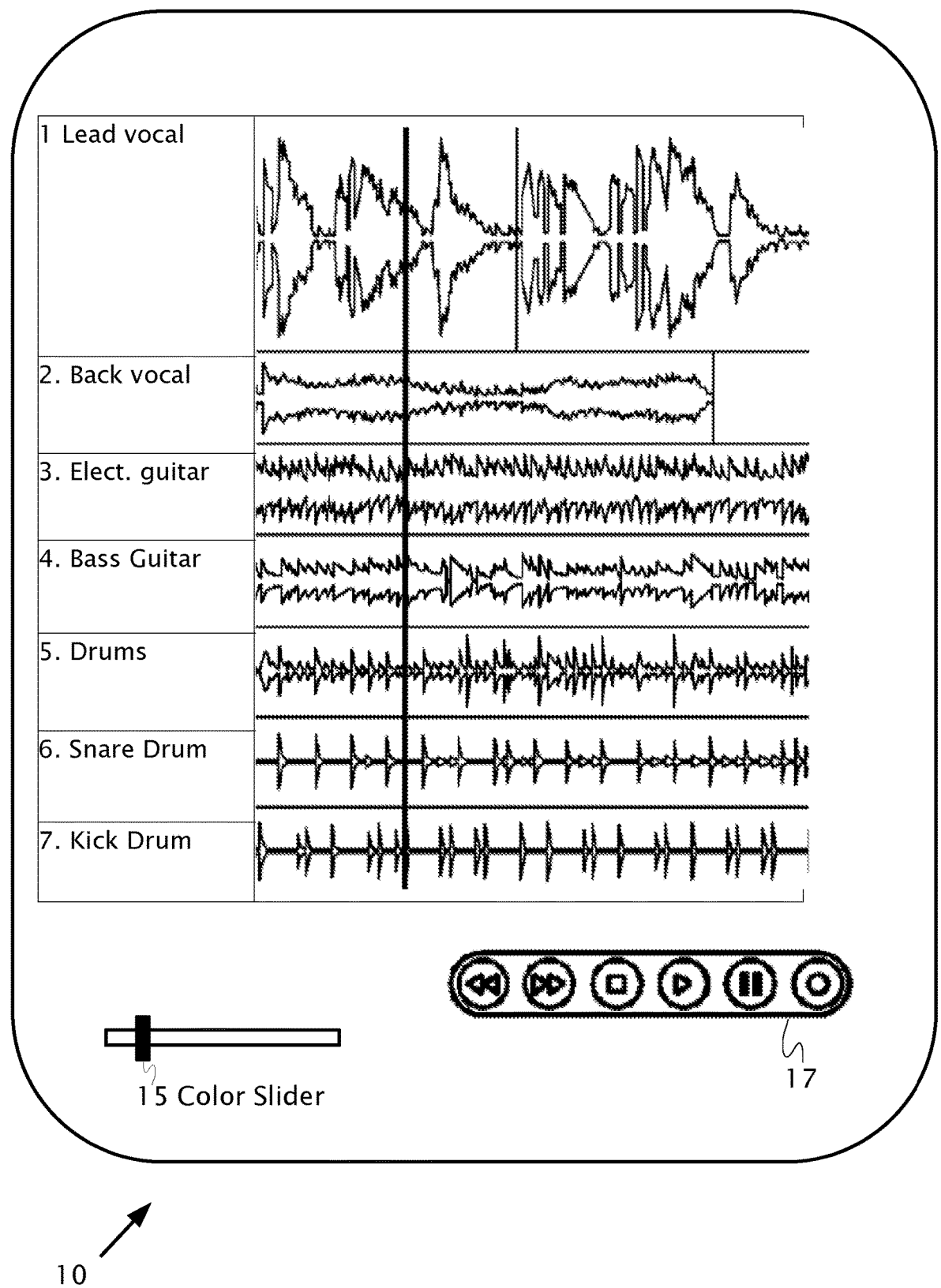
FIG. 1 illustrates schematically a portion of a user interface of a digital audio workstation, according to features of the present invention.

The foregoing and/or other aspects will become apparent from the following detailed description when considered in conjunction with the accompanying drawing figures.

DETAILED DESCRIPTION

Reference will now be made in detail to features of the present invention, examples of which are illustrated in the accompanying drawings, wherein like reference numerals refer to the like elements throughout. The features are described below to explain the present invention by referring to the figures.

By way of introduction, various embodiments of the present invention are directed to mixing multiple audio tracks into a playable audio file or mix which contains audio content of the tracks but with individual audio processing and individual gains. For example, a song may be recorded with multiple microphones not necessarily at the same time. There may be audio tracks for each instrument or voice; or multiple audio tracks from multiple respective microphones of the same instrument or voice. The audio tracks may be audio processed individually and mixed into an audio mix from all the audio sources intending to produce a pleasant sound experience when the audio mix is played.

In a live performance with multiple microphones, signals from the microphones may be mixed together and amplified to be heard by the audience. In this live scenario, among others, it is desirable to set levels of the audio tracks in a manner which achieves specific tonal or acoustic properties that are perceived by the audience.

Referring now to the drawings, reference is now made to FIG. 1, which illustrates schematically a portion of a user interface 10 of a digital audio workstation, according to features of the present invention. Audio tracks 1-7 are represented in user interface 10, by way of example. A user may select audio tracks 1-7 for mixing. The audio mix may be played using play controls 17. According to features of the present invention, individual gains may be calculated respectively for multiple audio tracks based on respective audio content, e.g. frequency content, of the audio tracks. The gains may be distinct and may be determined responsive to a control parameter. The control parameter may be set by a user using an analogue control or color slider 15 integrated into user interface 10. When moving color slider 15 in one direction from its initial position, the overall mixed summation of audio tracks 1-7 may be perceived as containing more high frequency (i.e. bright/treble) and in another direction as containing more low frequency (i.e. dark/bass).

Figure 2:
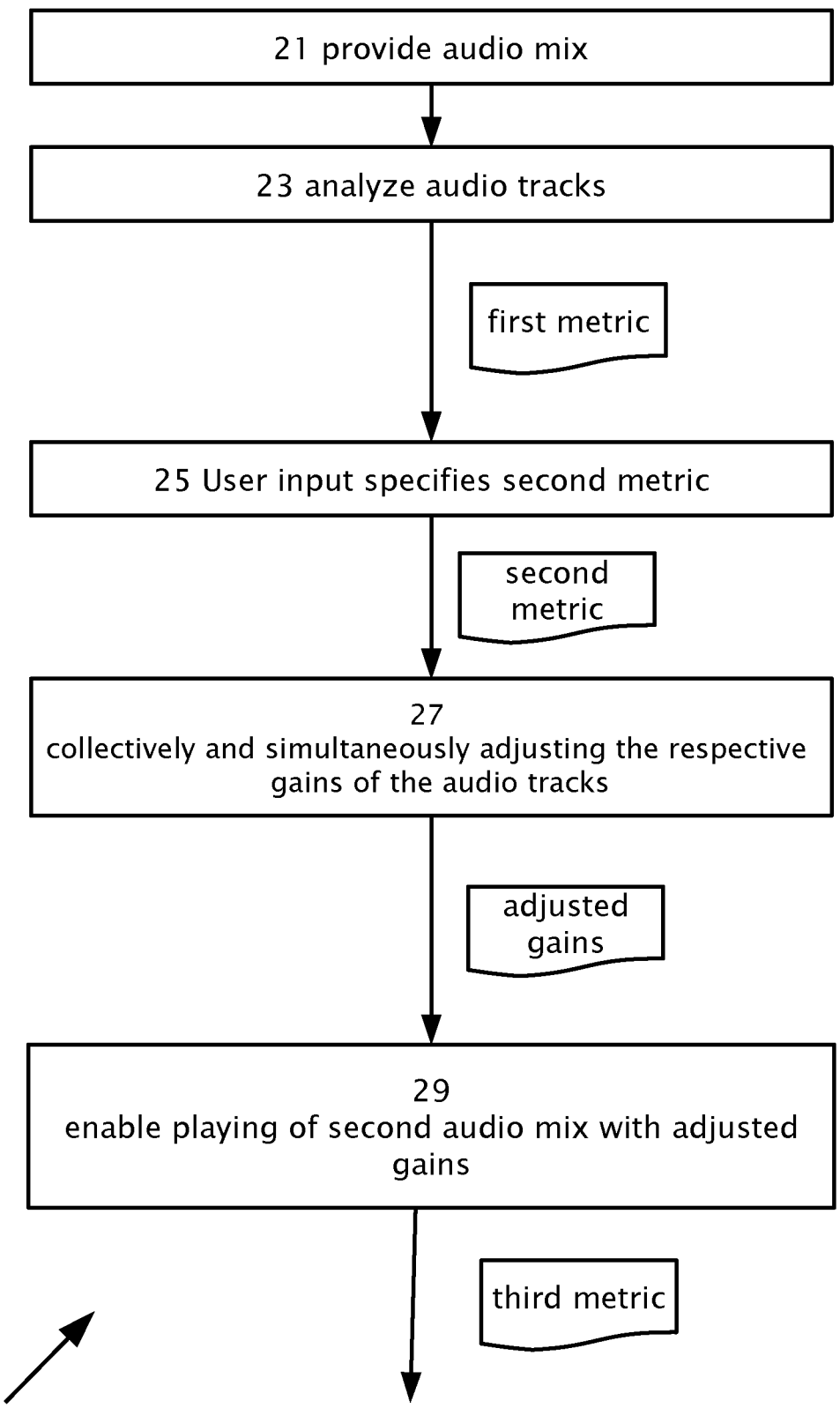
FIG. 2 is a simplified flow diagram illustrating a method, according to features of the present invention.

Different embodiments of the present invention may be configured to achieve generally a target such as more loudness (i.e. bass and treble) or an arbitrary tonal shape/frequency response/contour equalization (EQ) target Reference is now also made to FIG. 2 a flow diagram 20 illustrating a method 20, according to features of the present invention, directed to determine for the audio tracks respective gains based on respective frequency content of the audio tracks. An audio mix is provided (step 21) including audio tracks and respective initial gains. Audio tracks are individually analyzed (step 23) to produce a first metric or attribute of frequency content of the audio tracks. A user using color slider 15, for instance may input a control parameter which specifies (step 25) a second metric which may be an attribute of frequency content desired by the user when playing the audio mix. Responsive to the user input, the initial gains of the audio tracks are collectively and simultaneously adjusted (step 27) to produce respective adjusted gains of the audio tracks. The audio mix may be played (step 29) with the adjusted gains. The audio mix when played (step 29) with the adjusted gains may have an attribute, i.e. third metric, of frequency content different from the initial attribute, i.e.

first metric. The third metric is more similar to or closer to the frequency content attribute, i.e. second metric specified by user input 25, than the first metric.

Figure 3:
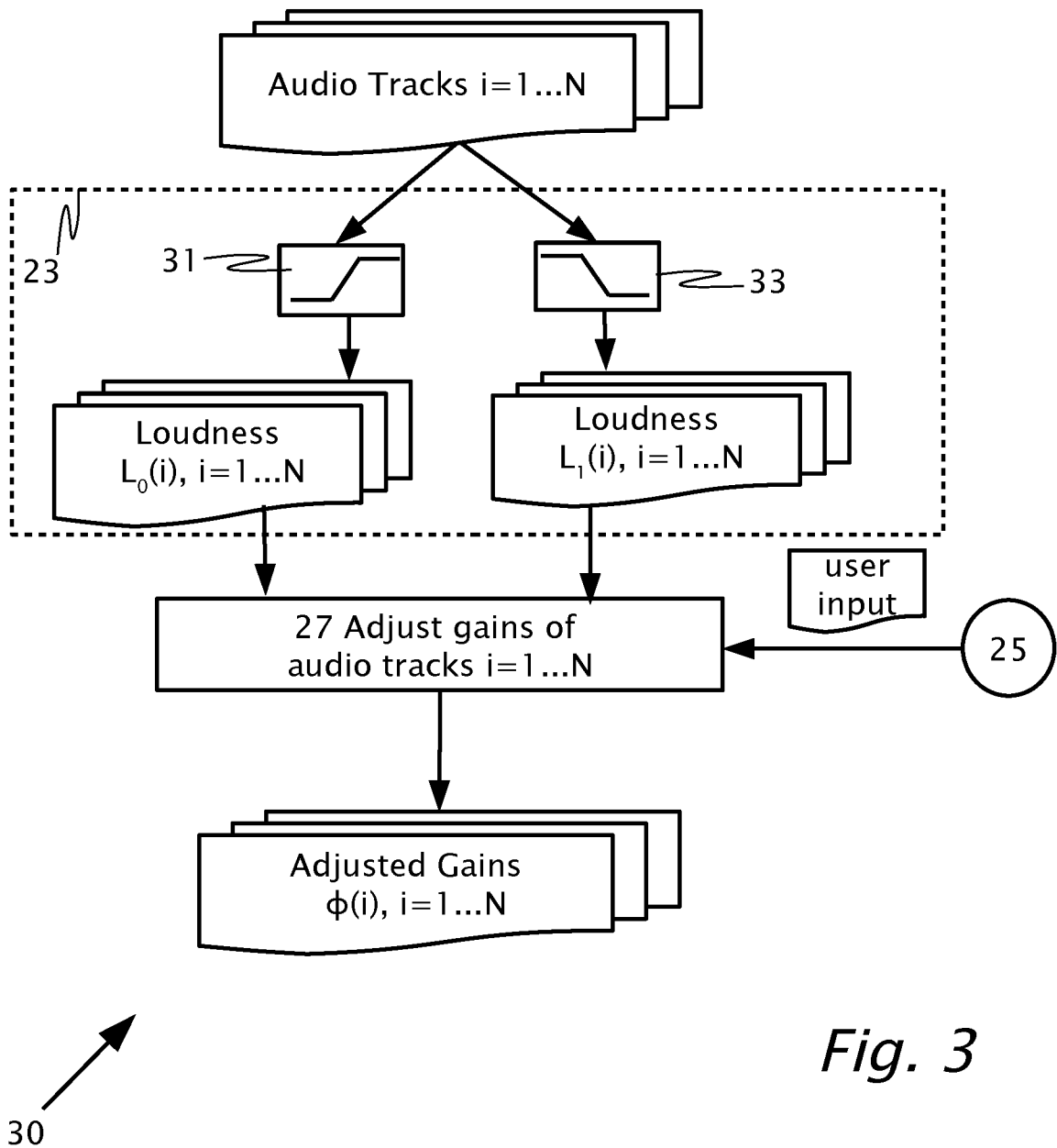
FIG. 3 is a simplified flow diagram, according to features of the present invention, which illustrates in further detail an example of analyzing audio tracks and adjusting gains.

Reference is now also made to FIG. 3, a flow diagram 30, according to features of the present invention which illustrates in further detail an example of analyzing audio tracks (step 23) and adjusting gains (step 27) of the audio tracks responsive to user input (step 25).

Adjusted gains may be determined using a computation that utilizes two values A0 and A1 for each audio track, which relate to a control parameter, e.g. position of slider 15.

The first value A0 may correspond to the audio track's effect on a first setting of slider 15, e.g., the "dark" side, in the dark/bright usage example.

The second value A1 may correspond to the audio track's effect on a second setting of slider 15, e.g., the "bright" side, in the dark/bright usage example.

A first filter 31, e.g. a shelving filter, may be provided which attenuates a lower frequency band and/or boosts a higher frequency band. Loudness $L_0$ in decibels may be measured of the audio track after filtering the audio track with shelving filter 31 which emphasizes the treble content of the audio track.

Similarly, a second filter 33 may be used which emphasizes the bass content of the audio track. Second filter 33 may be a shelving filter such as first filter 31 inverted. Loudness $L_1$ of the audio track in decibels may be measured using second filter 33 similarly to first filter 31. Loudness measurements $L_0(i)$ and $L_1(i)$ upon applying respective filters 31 and 33 of audio tracks i are an example of a first metric (FIG. 1) of frequency content produced by analyzing (step 23) audio tracks.

Adjusted gains for audio track i may be calculated from the loudness measurements $L_0(i)$ and $L_1(i)$ as follows:

$L_0(i) = \text{Loudness}(i, A0)$ $L_1(i) = \text{Loudness}(i, A1)$

Combined logarithmic gain factor $\Phi_{db}(i)$ in decibels for audio track i may be given by:

$\Phi_{db}(i) = L_0(i) - L_1(i)$

In general, combined audio track logarithmic gain factor $\Phi_{db}$ in decibels may be given by:

$f(A0) - f(A1)$ where $f$ is a general measurable audio property.

It may be convenient to normalize the audio tracks so that the overall loudness (or general measurable audio property) does not drift. Combined logarithmic gain $\Phi_{db}(i)$ of each audio track i is then replaced by:

$$\frac{\Phi_{db}(i) - \mu}{\sigma}$$

where $\mu$ is a mean combined logarithmic gain over audio tracks i and $\sigma$ is a standard deviation of combined logarithmic gain $\Phi_{db}(i)$ over audio tracks i.

Linear gain $\Phi_{lin}(i)$ for audio track i is given by:

$\Phi_{lin} = 10^{(\Phi_{db}/20)}$

Using linear gain $\Phi_{lin}$, audio track i undergoes multiplicative gain compensation based on slider 15 position which may be designated as a bounded between [0.0 to 1.0] and where 0.5 is the neutral middle position, by way of example.

The adjusted gain of an audio track may be determined as linear interpolation between respective gains at:
a first point of slider 15, e.g. $\alpha = 0.0$:

$\mu 0 = 1.0/\Phi_{lin}$, and a second point of slider 15, $\alpha = 1.0$:

$\mu 1 = 1.0 \cdot \Phi_{lin}$,

Specifically, the adjusted gain, over a varying between [0.0 to 1.0] may be:

$\mu 0 \cdot \alpha + \mu 1 \cdot (1.0 - \alpha)$

In general, adjusted gain=g($\alpha$, initial audio track gain) where g represents a general function.

Method 30 according to features of the present invention may be used to obtain loudness perception using two filters 31, 33 emphasizing low and high frequencies respectively. Upon a mix including various initial gains for each audio track, the adjusted gains are determined according to embodiments of the present invention to provide relative levels between the audio tracks that cause the audio mix to become darker or brighter (i.e. more treble or bass) dependent on the control parameter or slider 15 position.

Filters 31, 33 may be of any general form which determines the overall effect of slider 15. A filter may be targeted for a specific equalization contour so that moving slider 15 may cause frequency metrics of the audio mix to tend to meet the target in one position of slider 15 and tend to miss the target in another position of the slider 15.

Figure 4:
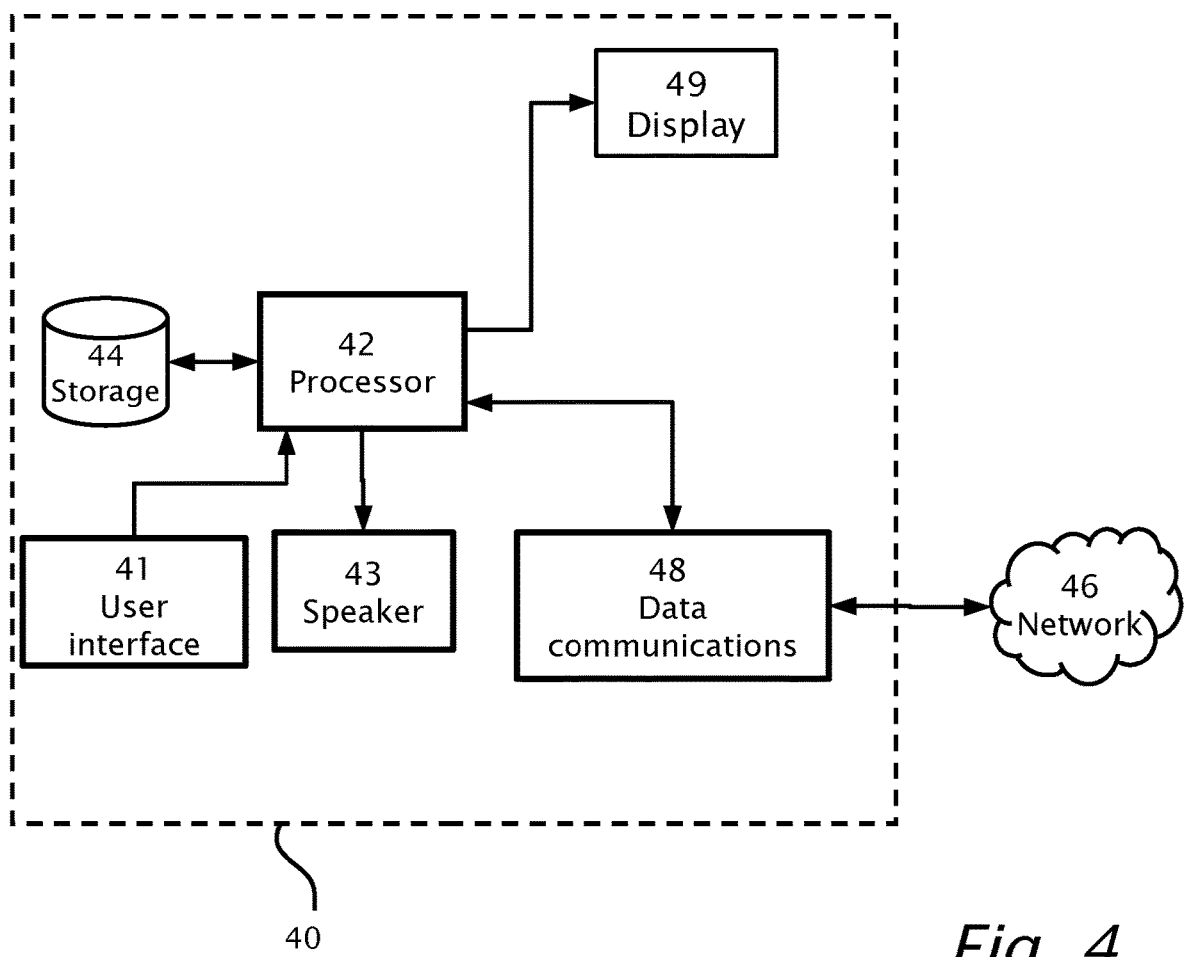
FIG. 4 illustrates schematically a conventional computer system.

Reference is now made to FIG. 4 which illustrates schematically a conventional computer system 40. Computer system 40 may include a processor 42 connected to local data storage 44. A data communications module 48 may connect processor 42 to data network 46 and remote storage. Computer system 40 may include connected to processor 42, peripheral accessory devices such as a display 49 and a user interface 41, e.g. mouse/keyboard, and a speaker 43.

The embodiments of the present invention may comprise a general-purpose or special-purpose computer system including various computer hardware components, which are discussed in greater detail herein. Embodiments within the scope of the present invention also include computer-readable media for carrying or having computer-executable instructions, computer-readable instructions, or data structures stored thereon. Such computer-readable media may be any available media, transitory and/or non-transitory which is accessible by a general-purpose or special-purpose computer system. By way of example, and not limitation, such computer-readable media can comprise physical storage media such as RAM, ROM, EPROM, flash disk, CD-ROM or other optical disk storage, magnetic disk storage or other magnetic or solid state storage devices, or any other media which can be used to carry or store desired program code means in the form of computer-executable instructions, computer-readable instructions, or data structures and which may be accessed by a general-purpose or special-purpose computer system.

The term "audio track" as used herein refers to an audio signal which may be mixed or combined with other audio tracks to produce a playable audio production.

The term "audio mix" or "mix" refers to the playable audio production after multiple audio tracks are combined with suitable gains.

The terms "audio track and "channel" are used herein interchangeablely.

The term "original" audio track refers to an audio track as recorded prior to digital signal processing.

The terms "perceived frequency content", "tonal balance" "energy profile" "bright/dark" and "color" are used herein interchangeably and refer to the perception of frequency content of a mix of audio tracks.

The term "shelving filter" (also known as a shelf filter, shelf EQ, shelving EQ) is a filter which attenuates either the high end or the low end of an audio frequency spectrum, such as between 20-20000 kiloHertz.

The term "loudness" as used herein is the subjective perception of sound pressure. Loudness levels are normally expressed as a value relative to a reference value or beginning value.

The terms "gain", "amplitude" and "level" although not technically the same are interchangeable in the context of the present disclosure. Thus, adjusting a gain for an audio track results in an adjusted sound amplitude or an adjusted sound level of the audio track when played.

The term "collectively" as used herein refers to adjusting two or more gains with the same control mechanism or motion.

The term "independently" as used herein refers to adjusting two or more gains with without a direct, e.g. proportional, dependence between the two or more adjustments.

The term "metric" as used herein in the context of a metric of frequency content refers to one or more measured or perceived attributes of an audio track or audio mix.

The indefinite articles "a", "an" is used herein, such as "an audio track", "an amplitude" have the meaning of "one or more" that is "one or more audio tracks" or "one or more amplitudes".

All optional and preferred features and modifications of the described embodiments and dependent claims are usable in all aspects of the invention taught herein. Furthermore, the individual features of the dependent claims, as well as all optional and preferred features and modifications of the described embodiments are combinable and interchangeable with one another.

Although selected features of the present invention have been shown and described, it is to be understood the present invention is not limited to the described features.

The claimed invention is:

1. A method comprising:
   providing a first audio mix including a plurality of audio tracks and respective gains;
   individually analyzing the audio tracks using the respective gains to compute therefrom a first metric of frequency content;
   enabling a user input specifying a desired second metric of the frequency content; and
   responsive to the user input, collectively and simultaneously adjusting the respective gains of the audio tracks to produce respective adjusted gains of the audio tracks; wherein a second audio mix when played of the audio tracks with the respective adjusted gains has a third metric of frequency content different from the first metric of frequency content, and said third metric is closer to said second metric than said first metric.

2. The method of claim 1, further comprising:
   enabling mixing the audio tracks using the respective adjusted gains into the second audio mix; and
   enabling playing the second audio mix.

3. The method of claim 1, further comprising:
   providing a control configured for collectively and simultaneously adjusting the respective gains of the audio tracks.

4. The method of claim 1, wherein the second metric is responsive to a control parameter for collectively and simultaneously adjusting the respective gains of the audio tracks.

5. The method of claim 1, wherein the second metric of the second audio mix is responsive to a single control parameter for said collectively and simultaneously adjusting the respective gains of the audio tracks.

6. The method of claim 1, wherein said analyzing the audio tracks includes:
   providing a previously determined frequency-dependent audio filter;
   applying the audio filter respectively to the audio tracks and measuring therefrom respective values of loudness, and wherein said collectively and simultaneously adjusting the respective gains of the audio tracks is responsive to the values of loudness.

7. The method of claim 1, wherein said analyzing the audio tracks includes:
   providing a plurality of previously determined frequency-dependent audio filters including a first filter and a second filter, wherein said first filter and said second filter have different audio frequency responses;
   applying the first filter and the second filter respectively to the audio tracks and measuring therefrom values of loudness respective to the first filter and the second filter; and
   said collectively and simultaneously adjusting the respective gains of the audio tracks responsive to a difference between the values of loudness respective to the first filter and the second filter.

8. The method of claim 1, wherein said collective and simultaneously adjusting the respective gains of the audio tracks includes normalization thereby maintaining loudness of the second audio mix.

9. A computerized system comprising a processor and storage, the computerized system operable to:
   provide a first audio mix including a plurality of audio tracks and respective gains;

individually analyze the audio tracks using the respective gains to compute therefrom a first metric of frequency content;

enable a user input specifying a desired second metric of the frequency content;

responsive to the user input, collectively and simultaneously adjust the respective gains of the audio tracks to produce respective adjusted gains of the audio tracks; wherein a second audio mix when played of the audio tracks with the respective adjusted gains has a third metric of frequency content different from the first metric of frequency content, and said third metric is closer to said second metric than said first metric.

10. The computerized system of claim 9, further operable to:

mix the audio tracks using the respective adjusted gains into the second audio mix; and play the second audio mix.

11. The computerized system of claim 9, further comprising:

a control configured for collective and simultaneous adjustment of the respective gains of the audio tracks.

12. The computerized system of claim 9, wherein the second metric is responsive to a control parameter for collective and simultaneous adjustment of the respective gains of the audio tracks.

13. The computerized system of claim 9, wherein the second metric is responsive to a single control parameter for collective and simultaneous adjustment of the respective gains of the audio tracks.

14. The computerized system of claim 9, further comprising:

a previously determined frequency-dependent audio filter, wherein the audio filter is applied to the audio tracks and respective values of loudness are measured therefrom, wherein the respective gains of the audio tracks are collectively and simultaneously adjusted responsive to the values of loudness.

15. The computerized system of claim 9, further comprising:

a plurality of previously determined frequency-dependent audio filters including a first filter and a second filter, wherein said first filter and said second filter have different audio frequency responses;

wherein the first filter and the second filter are applied respectively to the audio tracks to measure therefrom values of loudness respective to the first filter and the second filter; and wherein respective gain adjustment of the audio tracks is responsive to a difference between the values of loudness.

16. The computerized system of claim 9, wherein collective and simultaneous adjustment of the respective gains of the audio tracks includes normalization to maintain loudness of the second audio mix.

17. A user interface of a digital audio workstation, the user interface comprising:

a visual representation of a plurality of audio tracks;

an option to mix the audio tracks into a first audio mix using respective gains of the audio tracks;

a mechanism operable to individually analyze the audio tracks using the respective gains to compute therefrom a first metric of frequency content;

a user input specifying a desired second metric of the frequency content;

a mechanism operable to collectively and simultaneously adjust the respective gains of the audio tracks to produce respective adjusted gains of the audio tracks;

a mechanism for mixing the audio tracks with the respective adjusted gains into a second audio mix, wherein the second audio mix when played of the audio tracks has a third metric of frequency content different from the first metric of frequency content, and wherein said third metric is closer to said second metric than said first metric; and a mechanism configured to enable playing the second audio mix.

18. The user interface of claim 17, wherein the mechanism operable to collectively and simultaneously adjust the respective gains of the audio tracks is a single control mechanism.

* * * * *